United States Patent [19]

Mills et al.

[11] Patent Number: 5,647,748

[45] Date of Patent: Jul. 15, 1997

[54] PRINTED CIRCUIT BOARD GROUND CLIP

[75] Inventors: R. Steven Mills; Jerry D. Gandre; Steve L. Sands; Gita P. Khadem, all of Austin, Tex.

[73] Assignee: Dell Computer Corporation, Austin, Tex.

[21] Appl. No.: 502,409

[22] Filed: Jul. 14, 1995

[51] Int. Cl.[6] .................................................. H01R 9/09
[52] U.S. Cl. ........................... 439/81; 439/947; 174/35 R
[58] Field of Search .......................... 439/92, 95, 75–79, 439/947, 81–83; 174/35 R, 51; 361/816, 817

[56] References Cited

U.S. PATENT DOCUMENTS

| | | | |
|---|---|---|---|
| 2,869,107 | 1/1959 | Engel | 439/82 |
| 4,640,561 | 2/1987 | George | 439/77 |
| 4,755,147 | 7/1988 | Young | 439/92 |
| 4,907,975 | 3/1990 | Dranchak et al. | 439/77 |
| 4,921,431 | 5/1990 | Garay et al. | 439/79 |
| 5,080,597 | 1/1992 | Seidel et al. | 439/95 |
| 5,267,125 | 11/1993 | Liu | 174/51 |
| 5,391,098 | 2/1995 | Ohashi | 439/78 |
| 5,451,167 | 9/1995 | Zielinski et al. | 439/92 |

Primary Examiner—Neil Abrams
Assistant Examiner—Brian J. Biggi
Attorney, Agent, or Firm—Kevin L. Daffer; Conley, Rose & Tayon

[57] ABSTRACT

A printed circuit board ground clip is provided having upwardly extending retainers and downwardly extending legs. The legs are designed to insert within plated-through holes of a variable thickness printed circuit board. The upwardly extending retainers terminate as a spaced pair of flanges which frictionally receive and electrically couple with a hook. The hook extends from the chassis of an electronic device, through a slot within the printed circuit board and between the spaced flanges. Accordingly, the hook and ground clip form an electrical conduit between a ground supply connected to the electronic device chassis and a ground conductor formed within the printed circuit board. Chassis-to-ground conductor attachment is performed during assembly of the board to the chassis backplane. Attachment can be quickly and easily reversed to allow board re-work, without requiring placement of heat upon the board. The present attachment mechanism further avoids user-inserted fasteners and the reliability problems they present.

20 Claims, 3 Drawing Sheets

PRINTED CIRCUIT BOARD GROUND CLIP

BACKGROUND OF THE INVENTION

1. Field of the Invention

This invention relates to an electronic device and more particularly to a ground clip for connecting a ground plane of a printed circuit board to the electronic device chassis.

2. Background of the Relevant Art

A electronic device is one which carries forward electrical functions within the confines of an electronic device housing or chassis. The electronic device typically includes one or more printed circuit boards ("boards") rigidly held within the chassis. Each board is designed with printed conductors arranged upon one or more layers extending across the board. The printed conductors provide interconnect of components secured upon one or both outer planar surfaces of the board. As defined herein, "components" refer to integrated or discrete circuits well known in the semiconductor art.

Most industrial- and commercial-type boards are manufactured from rigid copper-clad, epoxy-impregnated glass fiber laminate. The printed conductors can be selectively formed by a subtractive or additive process. Either process includes tin, lead-tin, and/or gold plated upon the conductive material which forms the printed conductor. At the terminal ends of a set of printed conductors near the edge of the board is a row of edge-board contacts. The edge-board contacts are formed at the same time as the printed conductors, and are configured to allow mating of the board edge into a receptor connected upon the backplane surface of the electronic device chassis. Mating of the edge-board contacts to the receptor provides electrical communication of the components to the electronic device backplane.

Backplane connectivity is therefore carried out by laterally moving the board a spaced distance above, and relative to, the bottom portion (or base) of the electronic device chassis. It is important when effectuating the aforesaid connection that not only must the edge-board contacts securely mate with corresponding receptors, but it is equally important that any and all ground conductors within the board connect to the chassis. It would be desirable that ground conductor-to-chassis contact be made during board assembly to the backplane, and that the ground conductor be connected periodically along the chassis. Periodic electrical connection between the ground conductor and chassis is necessary to reduce voltage potential gradients within the ground conductor as well as within the chassis.

A ground conductor is formed during fabrication of a single layer or multi-layered board. The ground conductor is presented through photolithography as a printed conductive element extending across one or both outer planar surfaces of the board or within the board itself. In many instances, the ground conductor exists as a planar unit disposed within and entirely across a multi-layered board. When configured as a planar unit, the ground conductor serves to electrically decouple noise interference or cross-talk occurring between printed conductors insulatively spaced from the ground plane. It is preferable, therefore, that a multi-layered board have at least one ground conductor (or plane) configured within the board, and that the ground conductor be connected with maximum conductivity to a ground supply. To minimize voltage gradients and to maximize current-carrying capacity, it is further important that ground supply connection be made at spaced intervals along the ground conductor printed path.

The chassis of an electronic device is typically coupled to a ground supply via the third prong of a three-prong AC wall adapter. Among other reasons, a grounded chassis affords a grounded element which surrounds at least a portion of the board and components arranged across the board. The grounded chassis not only protects a user against shock when he or she touches the chassis but, more importantly, shields against deleterious amounts of electromagnetic interference (or "EMI") transmitted from the electronic device during operation. Reduction of EMI is not only necessary to meet consumer demand, but also provides a more reliable shield against noise interference and crosstalk often associated with EMI radiation. Connection of the ground supply to the chassis is relatively easy and is generally performed at the location in which the AC electrical cord enters the chassis. Reliable connection of the chassis to the ground conductor, however, is much more difficult.

There have been many conventional mechanisms used to electrically connect a chassis to a ground conductor. One popular mechanism involves placing a screw through the board and into the chassis. At the upper surface of the board is a conductive solder pad, onto which the lower surface of the screw head is designed to abut. The solder pad is coupled to the ground conductor through a via. The via is configured on the exposed planar surface of the board and/or is buried within the board itself. By tightening the screw into the chassis, the backside surface of the screw head contacts the solder pad resulting in an electrical path from the chassis to the ground conductor by way of the screw, solder pad and via. It is necessary that not only the hole through the board into which the screw is placed be aligned with the hole in the chassis, but it is also necessary that a via be reliably formed between the solder pad arranged on the upper surface of the board and all ground conductors formed upon and/or within the board. Placement of the screw is not only tedious and time consuming, but also must be performed with extreme care. Any slip of the tightening tool from the screw head to the board upper surface could not only damage the printed conductors or vias arranged thereon, but could also, in extreme cases, pierce or crack the insulative glass fiber laminate. Still further, tightening of the screw head backside surface upon the solder pad can dislodge solder particles from the solder pad which can migrate from the solder pad and possibly lodge between printed conductors, edge-board contacts and/or receptor contacts. Vibration or any type of relative motion between the screw head and underlying board caused, for example, by an operable electronic device or periodic movement of that device can, over time, result in reliability problems. Movement of the electronic device may cause the screw to loosen in a counter fashion or, more likely, movement of the device may cause dislodgement of solder underneath the head as the head moves relative to the solder pad. Movement of the head causes the head to sweep the relatively soft solder from the pad, resulting in eventual separation between the head and the solder pad. Any separation between the grounded screw and the solder pad will force an open circuit therebetween. An improperly grounded ground conductor can effect the operability of each and every component coupled to the ground conductor. It is therefore important that an alternative chassis-to-ground conductor connection be made which is less labor intensive, is less prone to user error, is less susceptible to solder dislodgement during assembly and operation, and is generally more reliable.

It would be desirable to employ a chassis-to-ground conductor attachment mechanism which avoids the use of a screw or any user-assembled, tightening-type fastener. The attachment mechanism must be one which is pre-assembled as part of the board. Moreover, to minimize the complexity of the attachment process, the desired attachment mechanism should allow mating of the ground conductor, at periodic intervals across the ground conductor, to the chassis at the same time in which the edge-board contacts are mated with the backplane receptor. The backplane receptor is defined as a receptor configured at the rear surface of the sheet metal chasis. The attachment mechanism must further be designed to allow removal of the board from the chassis without having to "re-work" the chassis-to-ground conductor contact points. More specifically, heating the contact points to relieve attachment of the board from the chassis must be avoided. Re-work heating of the contact points may jeopardize the solder connections of the components upon the board.

SUMMARY OF THE INVENTION

The problems outlined above are in large part solved by a ground clip of the present invention. That is, the ground clip hereof is designed for fixed placement upon a printed circuit board planar surface. The ground clip is designed with legs which extend toward and are soldered with a ground conductor arranged either upon the outer planar surface or within the board. The solder connection is carried out at the same time in which components are wave soldered upon the board. The ground clip is therefore fixedly held in electrical contact with the ground conductor.

Extending from the ground clip are a pair of retainers which terminate as a pair of flanges. The flanges are designed to separate upon ingress of a portion of the electronic device chassis, hereinafter referred to as "hook". Although the flanges are designed to separate, they are nonetheless biased toward one another and are designed to frictionally abut against the opposing sides of the inserted hook. Placement of the hook between the inwardly biased flanges accomplishes an electrical connection between the chassis and the ground conductor by way of the hook and ground clip. The present attachment mechanism avoids tightening-type fasteners, such as screws, and further avoids frictional contact upon solder pads and the possibility of dislodgement of solder resulting therefrom.

A plurality of hooks of the present design are configured to extend at a periodic spaced interval from a base of the chassis through corresponding slots arranged within the board. The chassis and electrical conductor are thereby connected to one another at spaced locations across the base of the chassis in order to minimize voltage gradient and maximize current-carrying capacity of the ground conductor. By placing the hooks through corresponding slots and laterally moving the board relative to the hooks, an inward-facing groove within each hook is dimensioned to receive the board at one end of each slot. The board is therefore secured by a single lateral movement within the groove of the hook at the same time in which the edge-board contacts couple with the backplane receptors. The hooks thereby provide mechanical securement of the board, and the ground clip flanges provide electrical connectivity at each hook location. Contact between the ground clip flanges and the sides of the hook is advantageously a frictional contact. If a board is found defective and must be replaced, the board, including the ground clip, can easily be removed from the hook without having to re-work the contact. Removal merely involves the release of a frictional force between the flanges and the side surfaces of the hook. No heating is required in releasing the ground clip from the hook.

Broadly speaking, the present invention contemplates a printed circuit board ground clip. The ground clip comprises an elongated base having end portions which are B bent to extend substantially parallel to each other at a spaced distance from each other. At least one leg extends from a first side of each of the two portions, and a retainer extends from a second side opposite the first side of each of the two portions. Each retainer terminates as a flange. The flange of one retainer is adapted to separate (or further separate) from the flange of the other retainer upon ingress of a hook inserted therebetween. The hook comprises a pair of opposed side surfaces upon which the flange of one retainer and the flange of the other retainer frictionally abut. The leg extending from each of the two portions is configured for placement into a plated hole formed within a printed circuit board. A key is also designed to extend from the first side of each of the two portions. A distance between the key extending from one of the two portions and one terminal end of the elongated base is equal to a distance between the key extending from the other of the two portions and the other terminal end of the elongated base. The key extending from each of the two portions is designed to eliminate the possibility of a user incorrectly inserting the ground clip into the plated holes. The keys are therefore used to prevent reverse-insertion of the ground clip onto the board.

The present invention further contemplates an assembly for electrically connecting a ground supply to a ground conductor of a printed circuit board. The assembly includes a printed circuit board having an elongated slot extending through the board between opposed planar surfaces of the board. The board further includes plated holes extending as two rows across a portion of the board, wherein the rows are spaced substantially parallel to each other and at least one of the plated holes is electrically connected to a ground conductor configured across at least a portion of the board. A hook, bearing a ground supply, is dimensioned to extend through the elongated slot and frictionally engage with the board at one end of the slot. A ground clip is also provided having a spaced plurality of legs and a pair of retainers extending opposite the legs toward one another. The ground clip legs are adapted for solder retention within respective plated holes, and the retainers are adapted to separate and bear against sides of the hook. The ground conductor is configured to extend across at least a portion of the board, either along an outer planar surface or along an intermediate planar region arranged parallel to and insulatively spaced between the opposed, outer planar surfaces.

The present invention still further contemplates a method for applying a ground potential to a ground conductor of a printed circuit board. The method includes the steps of providing a ground potential to a hook extending upward from a computer chassis. A ground conductor is formed across the printed circuit board having a slot formed through the board and a row of plated holes arranged on opposing sides of the slot. A ground clip is provided having a plurality of legs extending downward and a pair of retainers extending upward. The retainers are connected to the legs, and the legs are inserted into and soldered with the plated holes. The slot of the printed circuit board is then placed over the hook, and the board is then moved in a lateral direction relative to the hook to frictionally dispose an inward facing surface of the hook upon the board at one end of the slot.

BRIEF DESCRIPTION OF THE DRAWINGS

Other objects and advantages of the invention will become apparent upon reading the following detailed description and upon reference to the accompanying drawings in which.

Figure 1:
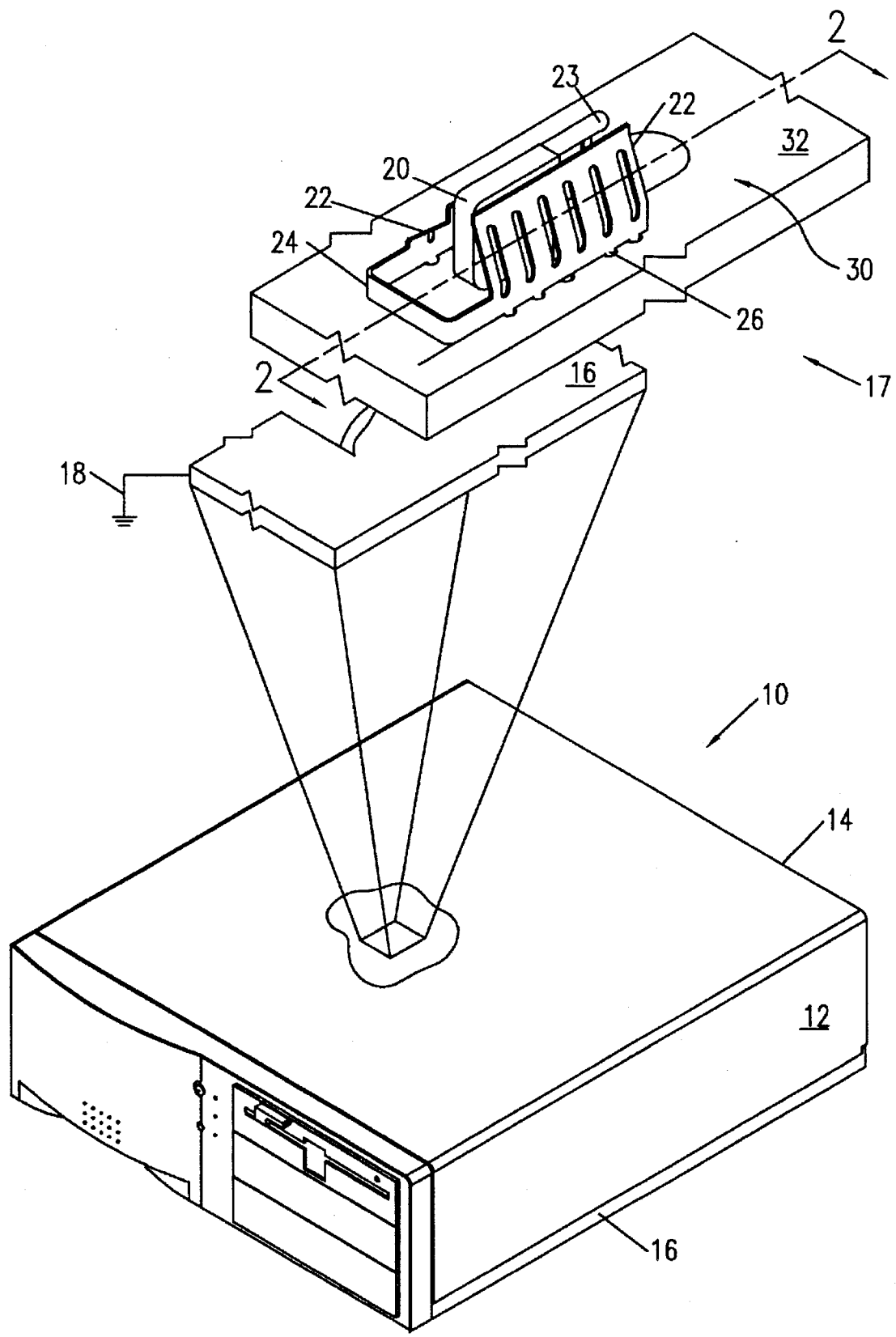
FIG. 1 is an electronic device with a chassis-to-ground conductor attachment mechanism of the present invention shown in exploded, isometric views.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates an electronic device 10. Electronic device 10 includes any device which carries forward electrical functions and is encompassed within a housing or chassis 12. An exemplary form of electronic device 10 is shown as personal computer (PC) having a rearward end 14 configured as a backplane. The backplane is designed to include a series of receptors (not shown) which extend toward the inside of chassis 12. Receptors allow connection of edge-board contacts thereto as described above. At least a portion of chassis 12, if not the entire chassis, is made of a conductive material. When connected to a ground supply, the conductive material of the chassis maintains ground potential across at least critical portions of the chassis necessary to minimize or "sink" EMI radiation generated by operable electronic components. Properly grounded chassis 12 thereby not only ensures a reliable ground potential to each and every component within device 10, but also prevents user shock during operation. A base 16 of chassis 12 is typically coupled to a ground supply derived from the third prong of a three-prong AC adapter plug.

The present attachment mechanism 17, is shown in FIG. 1 exploded from device 10. Base 16 is connected to ground supply 18, and extending upward at periodic intervals from base 16 are a plurality of hooks 20. Shown in FIG. 1 is single hook 20, however, it is understood that numerous hooks extend at spaced intervals from base 16 in accordance with the present invention. A singular hook is depicted for simplicity and brevity. Hook 20 is preferably a portion of base 16 bent upward from a horizontal to a vertical orientation. Hook 20, like base 16, is made from an electrically conductive material, a suitable conductive material being, but not limited to, galvanized steel. Depending upon the material chosen, hook 20 is of sufficient thickness to maintain its rigidity in an upright, vertical orientation. If hook 20 is made from galvanized steel, a suitable thickness of hook 20 is approximately 0.042 inches.

The thickness of hook 20 is chosen in order to allow firm, inward biasing force of retainers 22. Retainers 22 extend from an elongated base 24 to a termination point designated herein as a flange 23. Thus, flange 23 of each retainer 22 physically abuts and electrically couples with a side surface of hook 20. Retainer 22 extends from one surface of base 24, while a plurality of legs 26 extends from the other surface of base 24. Legs 26, base 24, retainers 22, and flanges 23 all comprise ground clip 30, the function of which is to provide removable, frictional coupling between a ground conductor (not shown in FIG. 1) within printed circuit board (board) 32 and grounded chassis 16.

Figure 2:
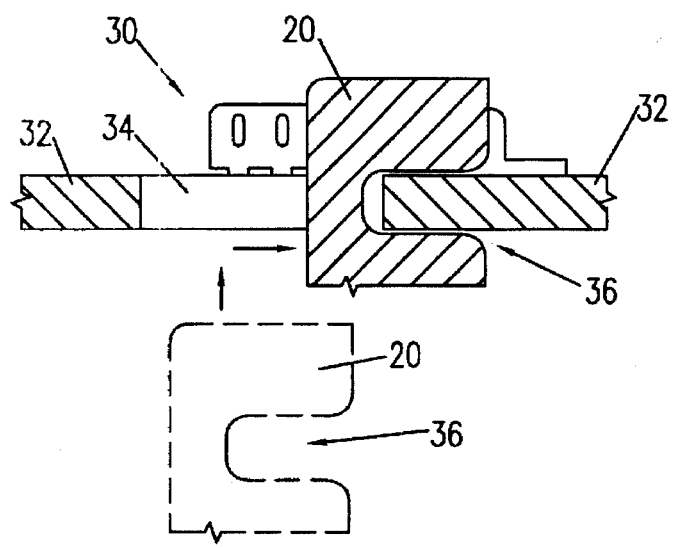
FIG. 2 is a partial cross-sectional view along plane 2—2 of FIG. 1.

Referring now to FIG. 2, a partial cross-sectional view along plane 2—2 of FIG. 1 is shown. Specifically, FIG. 2 illustrates slot 34 within board 32, and the placement of slot 34 over the upper portion of hook 20. Thereafter, lateral movement of board 32 relative to hook 20 allows frictional engagement and seating of hook 20 to board 32. Lateral movement of board 32 allows frictional reception of board 32 at one end of slot 34 within a groove 36 configured within hook 20. Groove 36 is therefore dimensioned with two substantially parallel, spaced surfaces which engage with opposing outer surfaces of board 32. Groove 36 is therefore slightly larger than board 32 thickness to allow slidable insertion. Suitably, groove 36 is approximately 0.005 inches larger than board 32 thickness. For example, if board 32 is 0.093 inches thick, then groove 36 will be almost 0.100 inches in inside dimension. Alternatively, if board 32 is 0.062 inches thick, then groove 36 is almost 0.070 inches in inside dimension. Board 32 of 0.093 inches and 0.062 inches are merely chosen as examples of currently popular eight-layer and six-layer, respectively, multi-layer board thicknesses. It is understood, however, that thicker or thinner boards are within the spirit and scope of the current configuration.

Lateral movement of board 32 relative to hook 20 not only allows coupling of board 32 to hook 20 but also allows coupling of edge-board contacts with receptors arranged upon the backplane surface. Thus, after slots 34 of board 32 are arranged over corresponding hooks 20, board 32 is laterally moved rearward of electronic device 10 such that the rearward directed edge of board 32 and associated edge-board contacts engage with the receptors of backplane 14. Electrical/mechanical connection of the printed conductors to the receptors via edge-board contacts is thereby performed simultaneous with periodic electrical connection of the ground conductor to the chassis.

Figure 3A:
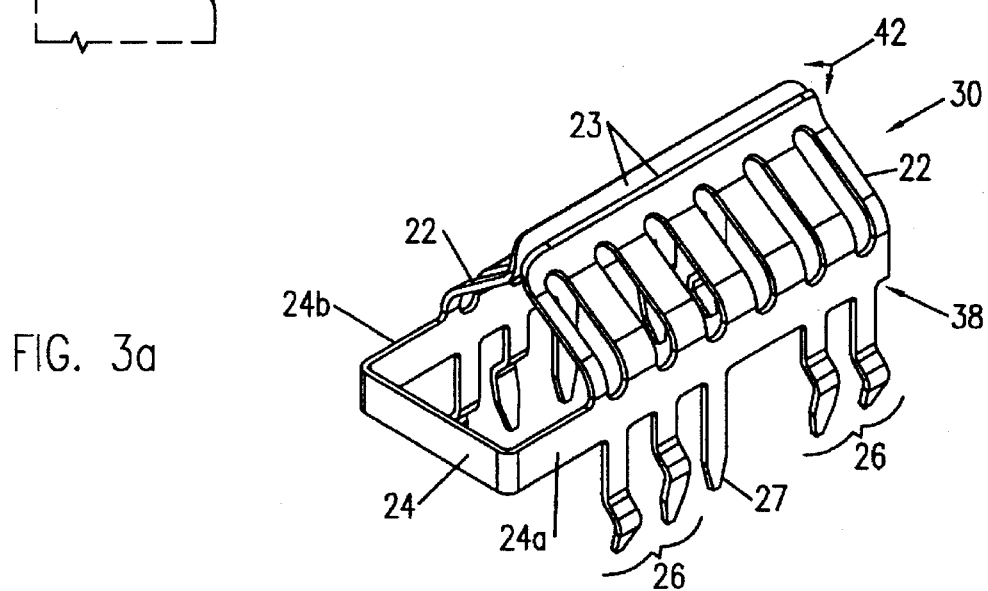
FIG. 3a is a top isometric view of a ground clip of the present invention.
Figure 3B:
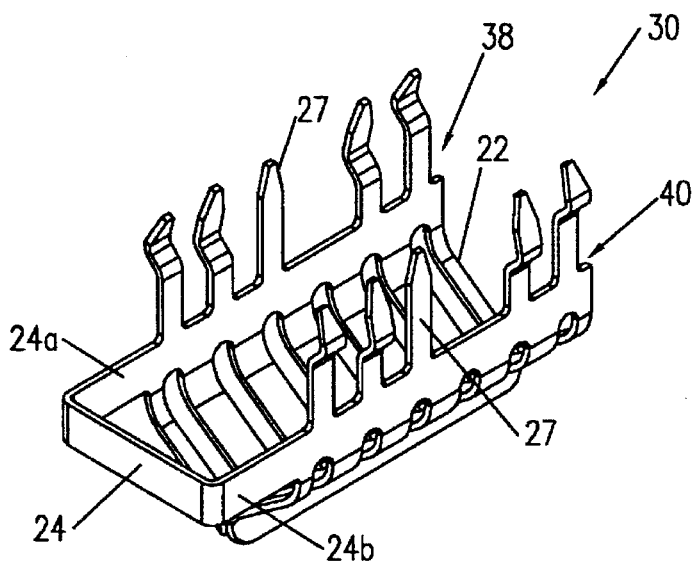
FIG. 3b is a bottom isometric view of the ground clip of the present invention.

Referring now to FIGS. 3a and 3b, isometric views of the top and bottom of ground clip 30 are respectively shown. Ground clip 30 includes an elongated base 24 which extends between terminal end 38 and terminal end 40. Base 24 is shown bent at two locations necessary to produce a pair of end portions 24a and 24b. End portions extend substantially parallel to each other between the bend areas and respective terminal ends 38 and 40. Extending from one side of each end portion 24a and 24b are a spaced series of legs 26. Extending from the other side of each portion 24a and 24b is a retainer 22. Each retainer 22 terminates as an inwardly facing surface, or flange 23.

Each portion of base 24, retainers 22 and legs 26 are formed as a single uni-body structure comprising ground clip 30. Ground clip 30 is made of a conductive material, suitably 0.008 inches thick. A suitable conductive material being beryllium (Be) and copper (Cu) in varying proportions necessary to form a conductive alloy. The Be and Cu material is preferably coated with a nickel (Ni) and tin (Sn) plating material. The plating material prevents against tarnishment and aids in solder reflow thereto. After legs 26 are inserted and wave soldered within board 32, flanges 32 are configured having a gap which is suitably 0.010 inches apart. A small gap of 0.010 inches is necessary to allow biased frictional force against the side surfaces of hook 20 which is suitably 0.042 inches thick. Insertion of hook 20 between flanges 23 thereby separates flanges 23 as shown by arrow 42 in FIG. 3a. Separation of flanges 23 causes an inward-biased force upon the side surfaces of hook 20 necessary to form a reliable, secure electrical coupling between hook 20 and clip 30.

Extending with legs 26 from each portion 24a and 24b is a corresponding key 27. Key 27 is dimensioned to allow insertion along with legs 26 within a plated hole of board 32. Key 27 extending from portion 24a is spaced from terminal end 38 a distance equal to the spacing between key 27 extending from portion 24b and terminal end 40. Key 27 thereby allows only one orientation of ground clip 30 upon board 32. By using the exemplary 3-2 (two legs plus key and two legs arrangement) clip 30 can only be inserted one way into corresponding plated holes. Prevention of reverse insertion is needed to assure terminal ends 38 and 40 will always face rearward toward backplane 14.

Figure 4:
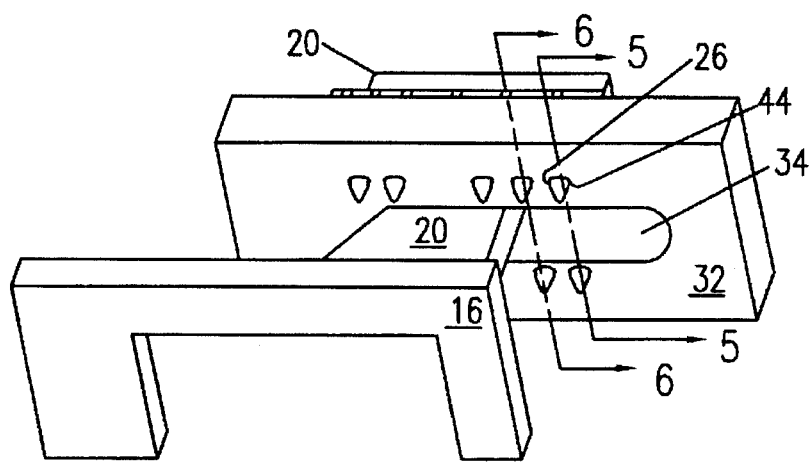
FIG. 4 is a bottom isometric view of the chassis-to-ground conductor attachment mechanism of FIG. 1.

Turning now to FIG. 4, the attachment mechanism in FIG. 1 is shown in bottom isometric view. FIG. 4 illustrates terminal ends of legs 26 extending through plated holes 44 within board 32. Holes 44 are arranged within two rows extending on opposite sides of slot Holes 44 allow insertion of legs 26 such that clip 30 straddles over slot 34. Placement of clip 30 above slot 34 allows hook 20 to extend through slot 34, in alignment with the gap between flanges 23. To complete the attachment mechanism, board 32 is slid in a lateral direction relative to chassis 16, causing hook 20 to slide within slot 34. The groove within hook 20 thereby frictionally couples over opposing surfaces of board 32 at one end of slot 34. Board 32 is thereby held in place a spaced distance above chassis 16 as a result of the groove-in-slot arrangement. Hook 20 is assured of connection to clip 30 as a result of the flange-to-hook abutment.

Figure 5:
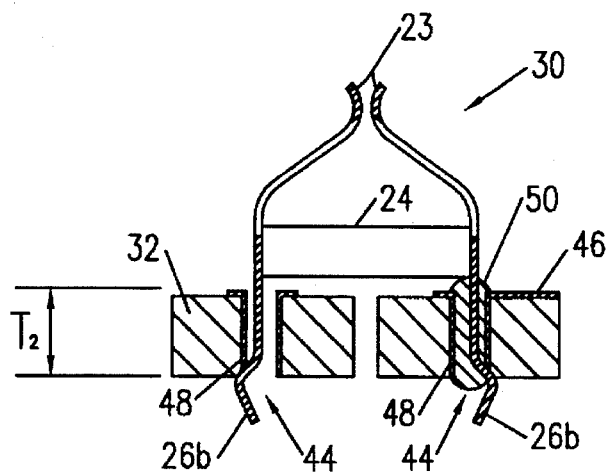
FIG. 5 is a cross-sectional view along plane 5—5 of FIG. 4.

Turning now to FIG. 5, a cross-sectional view along plane 5—5 of FIG. 4 is shown. Specifically, FIG. 5 illustrates a cross-sectional view of board 32 and clip 30, absent hook 20 and chassis 16. Board 32 is shown as being a multi-layer board having a ground conductor 46 arranged within a plane insulatively spaced from other conductors within board 32. Ground conductor 46 can, according to one embodiment, comprise an entire planar area across board 32. Ground conductor 46 is physically and electrically coupled to plated surfaces 48 formed on the inside of holes 44. The process of plating holes and making connection with buried layers is generally referred to as the plated-through hole technique (or "PTH process"). PTH process is well known in the industry as a mechanism for forming holes which serve to connect, through wave solder, component leads to buried conductors. Thus, holes 44, and the plating thereof, are developed during the normal PTH process used to form receptor holes for other component leads which are also coupled to board 32. Holes 44 are thereby formed during the normal fabrication cycle used in forming a multi-layer board 32. No additional steps or process sequences are necessary.

FIG. 5 illustrates a multi-layer board of thickness $T_1$. Multi-layer board 32 can have numerous inter-level elongated conductors or conductive planes spaced from each other within the board dielectric base material. Ground clip 30 is designed with at least one leg 26a extending from each end portion 24a and 24b. Accordingly, at least a pair of legs 26a are configured to extend through board 32 of thickness $T_1$. A bend is pre-formed within legs 26a such that the bend exists at a location just below the bottom surface of a receptor board. Bend within legs 26a is designed to abut a backside surface of a board of specified thickness during times in which the bottom edge of base 24 abuts the upper surface of board 32. The bend within legs 26a thereby functions to snap-fit and retain the legs within hole 44 such that they cannot become easily dislodged from their seated position. After legs 26a are snap-fit in place, the legs are wave soldered at the same time in which leads of various other components mounted upon board 32 are wave soldered. The solder formed by the wave soldering technique is shown in FIG. 5 as reference numeral 50. Wave soldering employs a well known technique in which a solder pot is used in conjunction with a solder pump and nozzle to form a solder wave across contact points of interest. The same step used in soldering leads in various other electrical components is simultaneously used to wave solder legs 26a within holes 44.

Figure 6:
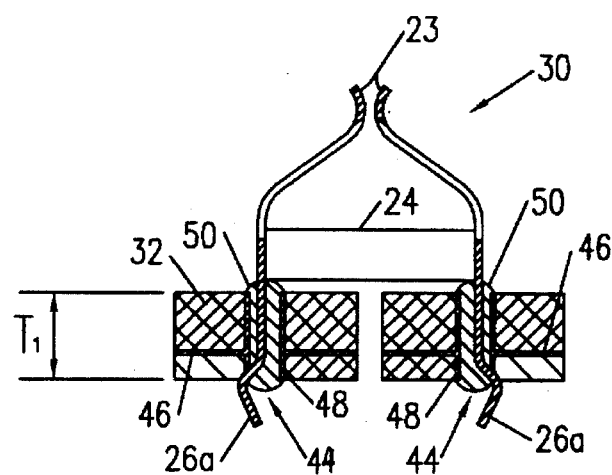
FIG. 6 is a cross-sectional view along plane 6—6 of FIG. 4 illustrative of the ground clip placed in a board which is thinner than the board of FIG. 5.

Turning now to FIG. 6, an alternate arrangement of ground conductor 46 is shown. Specifically, ground conductor 46 is shown as a printed element upon an outer planar surface of board 32. Instead of having x number of embedded layers, such as those shown in FIG. 5, the ground conductor can be drawn from within the board such that the resulting board will have x-1 or x-2 layers embedded within board 32. Accordingly, board 32 of FIG. 6 has a thickness $T_2$ less than $T_1$. The thinner board is accommodated by legs 26b configuration dissimilar from legs 26a configuration. Specifically, legs 26b include bend locations which are, relative to legs 26a, further from the distal end of the legs. The bend locations are chosen to abut against the backside surface of board 32 at the same time in which clip 30 is inserted and base 24 abuts against the front side surface of board 32.

FIGS. 5 and 6 illustrate at least two pairs of legs having bend locations dissimilar from each other. One pair of legs includes bends which receive a board of one thickness, while another pair of legs can receive a board of another thickness. Accordingly, legs 26 of clip 30 are designed to snap-fit, and temporarily receive boards of varying thickness to aid in the subsequent placement of solder around the legs and within the plated hole.

It will be appreciated to those skilled in the art having the benefit of this disclosure that this invention is capable of applications with numerous types of board configurations secured within numerous types of electronic devices. The present ground clip is inserted within the board during times in which various electrical components are mounted upon the board. Thus, the ground clip mounts similar to an electrical component, with legs extending as leads through plated-through-holes within the board. It is to be understood that the form of the invention shown and described is to be taken as exemplary presently preferred embodiments. Various modifications and changes may be made without departing from the spirit and scope of the invention as set forth in the claims. It is intended that the following claims be interpreted to embrace all such modifications and changes and, accordingly, the specification and drawings are to be regarded in an illustrative means rather than a restrictive sense.

What is claimed is:

1. A printed circuit board ground clip, comprising:

an elongated base having two end portions which are bent to extend substantially parallel to each other at a spaced distance from each other;

at least one leg extending from a first side of each said two end portions;

a retainer extending from a second side opposite the first side of each said two end portions, wherein said retainer terminates as a flange; and a ground supply bearing hook dimensioned to extend through said ground clip so as to frictionally engage with said flanges of said ground clip, and additionally frictionally engage with a printed circuit board supporting said ground clip by laterally moving said printed circuit board relative to said hook so that a groove in said hook embraces a top and a bottom surface of said printed circuit board.

2. The printed circuit board ground clip as recited in claim 1, wherein the flange of one said retainer is adapted to separate from the flange of the other said retainer upon ingress of said hook placed therebetween.

3. The printed circuit board ground clip as recited in claim 2, wherein said hook comprises a pair of opposed side surfaces upon which the flange of one said retainer and the flange of the other said retainer frictionally abut.

4. The printed circuit board ground clip as recited in claim 3, wherein said frictional abutment comprises an electrically conductive path between said ground clip and said hook.

5. The printed circuit board ground clip as recited in claim 1, wherein the leg extending from said two portions is configured for placement into a plated hole formed within a printed circuit board.

6. The printed circuit board ground clip as recited in claim 1, further comprising a key extending from the first side of each said two portions, wherein a distance between the key extending from one of said two portions and one terminal end of said elongated base is equal to a distance between the key extending from the other of said two portions and the other terminal end of said elongated base.

7. The printed circuit board ground clip as recited in claim 6, wherein said key extending from each said two portions is configured for placement into a plated hole formed within a printed circuit board.

8. The printed circuit board ground clip as recited in claim 1, wherein said ground clip is a metal selected from the group consisting of Be, Cu, C and steel.

9. An assembly for electrically connecting a ground supply to a ground conductor of a printed circuit board, comprising:

a printed circuit board having an elongated slot extending through the board between opposed planar surfaces of the board, said board further having plated holes extending as two rows across a portion of said board wherein said rows are spaced substantially parallel to each other and each of the plated holes is electrically connected to a ground conductor configured across a portion of said board;

a ground clip having a spaced plurality of legs and a pair of retainers extending from the ground clip toward one another, said legs are adapted for solder retention within respective said plated holes and flanges at terminal ends of said retainers are adapted to separate and bear against sides of a ground supply bearing hook; and said ground supply bearing hook dimensioned to extend through said elongated slot so as to frictionally engage with said flanges of said ground clip, and additionally frictionally engage with a printed circuit board supporting said ground clip by laterally moving said printed circuit board relative to said hook so that a groove of said hook embraces a top and a bottom surface of said printed circuit board.

10. The assembly as recited in claim 9, wherein said ground conductor extends across a portion of one of said opposed planar surfaces.

11. The assembly as recited in claim 9, wherein said ground conductor extends along an intermediate planar region arranged parallel to and insulatively spaced between said opposed planar surfaces.

12. The assembly as recited in claim 9, wherein said hook comprises an electrically conductive material connected to a chassis upon which said printed circuit board is attached.

13. The assembly as recited in claim 9, wherein said hook extends from and is electrically coupled to a chassis, and wherein the chassis is electrically coupled to a ground supply.

14. The assembly as recited in claim 9, wherein said flanges are made of electrically conductive material which electrically contacts the sides of said hook.

15. The assembly as recited in claim 9, wherein each of said plurality of legs are bent from a substantially straight position to an arcuate position, and wherein a first set of said legs are bent at a location closer to the end of said respective legs than a second set of said legs.

16. The assembly as recited in claim 15, wherein said first set of legs are bent at a location which abuts, during placement of said legs into said plated holes, against one of the opposed planar surfaces of a board of first thickness, and wherein said second set of legs are bent at a location which abuts, during placement of said legs into said plated holes, against one of the opposed planar surfaces of a board of second thickness.

17. A method for applying a ground potential to a ground conductor of a printed circuit board, comprising:

providing a ground potential to a hook extending upward from a computer chassis;

forming a ground conductor across a printed circuit board having a slot formed through the board and a row of plated holes arranged on opposing sides of the slot;

providing a ground clip having a plurality of legs extending downward and a pair of retainers extending upward connected to the legs;

inserting the legs of said ground clip into said plated holes and soldering said legs to said plated holes;

placing the slot over the hook to electrically couple the hook between the pair of retainers; and moving the board in a lateral direction relative to the hook to frictionally dispose an inward facing surface of the hook upon the board at one end of said slot.

18. The method as recited in claim 17, wherein the step of soldering said legs comprises wave soldering.

19. The method as recited in claim 17, wherein the step of providing the ground potential comprises connecting a ground supply to the computer chassis.

20. The method as recited in claim 17, wherein the step of moving the board occurs simultaneous with inserting an edge of the board into connectors configured upon a backplane of said chassis.

* * * * *